United States Patent [19]
Amin
[11] 3,785,837
[45] Jan. 15, 1974

[54] PARTIALLY CRYSTALLIZABLE GLASSES FOR PRODUCING LOW-K CROSSOVER DIELECTRICS

[75] Inventor: Rajnikant Babubhai Amin, Wilmington, Del.

[73] Assignee: E. I. du Pont de Nemours and Company, Wilmington, Del.

[22] Filed: June 14, 1972

[21] Appl. No.: 262,491

[52] U.S. Cl. .................... 106/52, 106/39.8, 106/48, 106/54, 317/258
[51] Int. Cl. ............................ C03c 3/22, C03c 3/30
[58] Field of Search ................ 106/52, 54, 48, 39.8, 106/73.31, 73.3

[56] References Cited

UNITED STATES PATENTS

| | | | |
|---|---|---|---|
| 3,464,836 | 9/1969 | Pendleton et al. | 106/52 |
| 3,586,522 | 6/1971 | Hoffman | 106/52 |
| 3,637,425 | 1/1972 | McMillan et al. | 106/52 |

*Primary Examiner*—Helen M. McCarthy
*Attorney*—James A. Forstner

[57] ABSTRACT

Partially crystallizable glasses of $BaO—ZnO—CaO—TiO_2—Al_2O_3—SiO_2$ which upon firing form crossover dielectrics for use in printed circuits. The glasses are in finely divided form and are optionally dispersed in an inert liquid vehicle. The resultant partially crystallized crossover dielectrics consist essentially of 20–48 percent by weight crystals (celsian, sphene and zinc orthosilicate) dispersed in a glassy matrix and exhibit reduced dielectric constant (K).

6 Claims, No Drawings

PARTIALLY CRYSTALLIZABLE GLASSES FOR PRODUCING LOW-K CROSSOVER DIELECTRICS

BACKGROUND OF THE INVENTION

This invention relates to printed circuits, and more particularly to novel glasses for producing crossover dielectrics for use in such circuits.

It is useful in fabricating printed circuits to be able to conserve space by disposing a metallization directly above other metallizations. Of course, to prevent shorting and capacitance coupling, such metallizations must be separated by dielectric material.

There are two ways to produce such multilayer structures. The first consists of printing and firing "crossover" layers between printed conductor layers on a single substrate, to form what is sometimes called a "multilevel" printed wiring board. The second method involves printing conductor patterns on organic-bonded thin "tapes" of particulate alumina, then laminating such printed tapes and firing the resultant laminated structure at high temperature to make a discrete monolithic multilayer structure which serves as its own substrate. The present invention describes the role of certain glasses in forming crossover dielectric layers in the "multilevel" type of process, wherein the substrate is a prefired ceramic, usually alumina.

A crossover dielectric composition is essentially a low dielectric constant insulator capable of separating two conductor patterns through several firing steps. High melting, viscous glasses have been used as the dielectric so that the firing of the top conductor line can be carried out at a temperature below that at which softening of the dielectric occurs. Melting or softening of the crossover dielectric is accompanied by shorting of the two conductor patterns against each other with subsequent failure of the electrical circuit. The major requirement for a crossover dielectric is control of resoftening or thermoplasticity in the top conductor firing step. Other property requirements are: (a) low dielectric constant to prevent A.C. capacitance coupling between the circuits insulated by the crossover dielectric, (b) low electric loss (high Q-value) to avoid dielectric heating, (c) low "pinholing" tendency and a low tendency to evolve gasses in firing, (d) proper glass precursor softening temperature so that the initial firing is adaptable to the screen printing process, (e) a high resistance to thermal shock crazing, and (f) low sensitivity to water vapor and subsequent spurious electrical losses.

In the present invention the glasses which are employed to print dielectric crossovers are partially crystallizable to form crystals in a matrix of glass. Partially crystallizable dielectrics afford the hybrid circuit manufacturer a new and uniquely useful processing parameter. In the initial stages of firing, the dielectric behaves as if it were a single-phase glass, going through the normal processes of sintering, softening and coalescing. As the initial period of firing is completed, however, crystals appear and cause a large increase in viscosity. In subsequent firing, there is little or no development of thermoplasticity, allowing overprinted metallizing or insulating layers to behave as if they were supported by a ceramic substrate instead of by a thermoplastic glass.

Hoffman U.S. Pat Nos. 3,586,522 and 3,656,984 disclose a PbO-based glass composition useful in forming partially crystallized crossover dielectrics. Those compositions upon being fired are partially crystallized to hexacelsian ($BaAl_2Si_2O_8$), with resulting increase in cross-over viscosity. The fired composition is a dispersion of such fine crystalline particles in a glassy matrix, and may be termed a "glass-ceramic."

There is a further need, however, for crossover dielectrics for use in multilevel circuitry which exhibit lower dielectric constants than those of U.S. Pat. Nos. 3,586,522 and 3,656,984, and consequently exhibit less A.C. capacitance coupling between the respective insulated circuits. It is to be stressed that for crossover dielectrics, the electronics industry desires the lowest possible dielectric constant, since the signals of the respective electrodes separated by the dielectric will tend to couple as capacitance rises, especially with high frequency signals.

SUMMARY OF INVENTION

This invention relates to finely divided partially crystallizable glasses (glass compositions) useful in producing crossover dielectrics for use in printed circuits. The glasses consist essentially of the components and proportions set forth in Table I.

TABLE I

| Component | Glass Compositions Weight Percent Preferred | Optimum | Operative |
|---|---|---|---|
| $SiO_2$ | 30–33 | 30 | 25–40 |
| $TiO_2$ | 8–10 | 8–10 | 5–15 |
| $Al_2O_3$ | 10–12 | 10 | 7–12 |
| BaO | 12–26 | 26 | 10–30 |
| ZnO | 10–26 | 10–12 | 10–26 |
| CaO | 6–10 | 6–10 | 2–10 |
| $B_2O_3$ | 2–8 | 4 | 2–8 |
| MgO | 0–2 | 2 | 0–2 |
| $Bi_2O_3$ | 0–4 | — | 0–4 |
| Total BaO plus ZnO | 30–40 | 36–38 | 30–40 |

The glasses in finely divided form may be printed (usually screen printed) onto a substrate either dry or as a dispersion in an inert liquid vehicle. In the dispersion generally there are 0.4 to 9 parts of glass per part of vehicle (by weight). When the glasses of the present invention are fired (e.g., at 850°–900°C.), a dense dielectric containing 20–48 percent by weight crystals dispersed in a glassy matrix is obtained. The crystals consist essentially of celsian as the major component in addition to lesser amounts of sphene and zinc orthosilicate. The crossovers exhibit lower dielectric constants than those heretofore obtained. The dielectric constants are often in the range 9–12, under the conditions set forth herein.

The glasses of the present invention are obtained by quenching from the molten state a mixture of batch components which form the claimed materials in the prescribed proportions. The glass composition of the present invention, after it is quenched from the molten state, is then finely ground prior to being printed between metallization layers on a dielectric substrate, and fired.

DETAILED DESCRIPTION

The glasses of this invention exploit various ingredients in a critical combination of proportions such that they possess highly desirable properties. The ingredients of the novel glasses are present within the composition ranges (expressed in weight percentages) prescribed in Table I.

A physical mixture of the glass ingredients (or precursors thereof) form stable glasses when quenched from the molten state, which stable glasses are the glasses of the present invention. In making the glasses of the present invention, there are employed certain critical proportions of glass formers. When the glasses have been finely ground, printed and fired on substrates, nucleation and partial crystallization of the glass are carried out in a single step, during the same relatively simple firing schedule, and, consequently, much more rapidly than with conventional crystallizing glasses. Once the glass softens and is held at the firing temperature for a sufficient period of time to crystallize, it becomes less thermoplastic.

The partially crystallized glass in the fired dielectric of the present invention contains a crystalline phase comprising 20–48 percent by weight of the total weight of glass and crystals. The crystals formed on firing are celsian ($BaAl_2Si_2O_8$) as the major crystalline phase, with sphene ($CaTiSiO_5$) and zinc orthosilicate [$(ZnO)_2$.$SiO_2$] as minor crystalline phases. Traces of $TiO_2$ may be present upon firing above 950°C. These crystalline phases are identified by X-ray diffraction. Their relative abundance in the fired crossover dielectric is, of course, dependent upon the length and temperature of firing, and the composition of the particular glass used as the starting material. The glass of Example 7 (below), e.g., when heated at a peak temperature of 850°–900°C. in a 45-minute cycle in a belt furnace, with 10 minutes at peak temperature, yields a crossover dielectric having over 40 percent (but not more than 48 percent) crystals, 36 percent being celsian, 5–6 percent being sphene and at most 2 percent being zinc orthosilicate.

Firing at 850°–900°C. peak temperature is preferred, in a belt furance (a symmetrical heating and cooling schedule), with about 5–15 minutes at peak temperature. Optimum time at peak is 8–12 minutes, in a 45-minute firing schedule. Temperatures outside the preferred peak temperature range of 850°–900°C. are possible, with proper adjustment of the firing schedule (total duration and duration at peak), as is obvious to those skilled in the art. Excessive firing conditions will result in undesirable surface roughening.

The proportions of the constituents in the unfired glasses of the present invention, and, therefore, in the fired partially crystallized crossover dielectrics of the present invention, are as follows. Silicon dioxide determines the softening characteristics, thermal expansion and chemical durability of the fired partially crystallized dielectric and is a constituent of the fired crystalline phase. The glasses contain 25–40 percent by weight silica.

Titanium dioxide is the crystallization catalyst and is also a constituent of the crystalline phase. Titanium dioxide is 5–15 percent of the glass.

Alumina is a constituent of the primary crystal phase which is produced upon firing, celsian. Alumina is present as 7–12 percent of the glass. Barium oxide and zinc oxide are in the crystal phase produced and are present as 12–30 percent and 10–26 percent, respectively, of the glass, the total amount of these oxides being in the range 30–40 percent. The oxides contribute to the low-firing capability of these glasses.

Calcium oxide is present as 2–10 percent of the glass to lower the melting point of the glass so that glass can be melted in conventional furnaces without difficulty. It is also one of the constituents of crystalline phase $CaTiSiO_5$.

Boric oxide (2–8 percent) is present in the glass as a viscosity reducer. Optional are MgO (0–4 percent) and $Bi_2O_3$ (0–4 percent), preferred and optimum proportions of all these glass components being set forth in Table I.

It should be understood that there may be other constituents which can be used in making the glasses of this invention, and, consequently, the partially crystallized crossover dielectrics of the present invention, and which do not introduce strong adverse effects.

The glasses of the present invention are prepared from suitable batch compositions of oxides (or oxide precursors) by melting any suitable batch composition which yields the prescribed compounds in the prescribed proportions. Metal oxides form stable glasses when quenched from the molten state, to produce the glasses. A physical mixture of metal oxides or oxide precursors such as metal hydroxides or carbonates may be employed. The batch composition to be utilized in preparing the glasses is first mixed and then melted to yield a substantially homogeneous fluid glass. The temperature maintained during this melting step is not critical, but is usually within the range 1450°–1500°C., so that rapid homogenation of the melt can be obtained. After a homogeneous fluid glass is obtained, it is generally poured into water or other liquid to form a glass frit.

The glasses used in making crossover dielectrics of the present invention are in finely divided form. The glass frit above is, therefore, ground finely in a conventional ball mill prior to dispersion in vehicle (if any) and printing. Glass powders having an average particle size not exceeding 44 microns in diameter are generally suitable, but those having average particle sizes of 1–15 microns are distinctly preferred. Generally, no particles in this preferred particle size should exceed 44 microns, that is the particles should pass through a 325-mesh screen (U.S. standard sieve scale). The particles used in the Examples had a surface area of about 1–2 $m^2/g$.

The glasses of the present invention are printed as a film onto a prefired metallized ceramic dielectric substrates in the conventional manner. Generally, screen stenciling techniques are preferably employed. The metallizing composition is printed as a finely divided powder either dry or in the form of a dispersion in an inert liquid vehicle. Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetate and propionates; terpenes such as pine oil, $\alpha$- and $\beta$-terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate. Alternately, the vehicle may contain waxes, thermoplastic resins or like materials which are thermofluids, so that the dispersion may be applied at an elevated temperature to a relatively cold ceramic substrate, upon which the glass composition sets immediately.

The ratio of inert vehicle to solids in this invention may vary considerably and depends upon the manner in which the dispersion is to be applied and the kind of vehicle used. Generally, from 0.4 to 9 parts by weight of solids per part by weight of vehicle will be used to produce a dispersion of the desired consistency. Perferably, 2–4 parts of solids per part of vehicle will be used.

As indicated above, the crossover compositions of the present invention are printed onto prefired ceramic substrates (with prefired metallizations thereon), after which the printed substrate is refired to mature the glass of the present invention and so produce the partially crystallized crossover dielectrics referred to above. Generally, the glass is fired in the temperature range 800°–950°C. to mature the glass and form the partially crystalline dielectric. Preferably, the firing is conducted at a peak temperature of 875°–900°C., typically for a total of 45 minutes with 10 minutes being at peak temperature.

Generally, in practicing the present invention, a suitable batch composition of oxides or oxide precursors is employed to produce glasses, which are then ground (and optionally dispersed in vehicle) to produce screen-printable compositions. It is possible to depart somewhat from the specific examples tabulated, provided that the glass compositions so produced have constituents present within the weight percentages prescribed in Table I.

The present invention is illustrated by the following examples. In the examples and elsewhere in the specification, all parts, ratios, and percentages of materials or components are by weight.

EXAMPLES 1–11

The glasses of Table II were prepared as follows in frit form from respective batch compositions of either the oxides or precursors of the oxides such as carbonates or hydroxides. Specifically, silica, titania, alumina and zinc oxide were introduced as oxides. Boric oxide was introduced as boric acid; barium oxide as barium carbonate; calcia as calcium carbonate, and magnesia as magnesium carbonate.

The dry batch components were weighed out, thoroughly mixed and introduced into a kyanite (aluminum silicate) crucible at 600°C. Crucible and contents were placed in an electric furnace and heated over three hours to 1450°–1500°C., and held at peak temperature for about ½ hour, until all gas evolution ceased and the contents were clear and transparent. Crucible and contents were removed from the furnace and the contents slowly poured into cold water. The frit formed by this process was placed in a ball mill jar with ceramic balls and water and ground (about 16 hours) until the product passed through a 325-mesh sieve (U.S. standard mesh). The slurry was vacuum filtered on paper and the solid product was dried; the dried cake was then micropulverized to break up the drying aggregates.

Each of the finely divided glasses 1 through 11 was dispersed in a vehicle of 10 percent ethyl cellulose and 90 percent β-terpineol. In some instances small amounts of petroleum oil (535°F. b.p. Magie Oil) were used to adjust viscosity of the dispersion. Three parts by weight of glass were used per part of vehicle.

The respective dispersions of dielectric composition were then each printed twice (200 mesh screen), dried after each print, on perfired metallized 96 percent alumina ceramic substrates which had been metallized with a conductor of one part palladium and 2 parts silver (Du Pont Pd/Ag 8151). Top electrode metallizations were then printed, crossing the bottom metallizations at the point where the dielectric compositions had been printed. The composition of the top electrode was identical to that of the bottom electrode on each substrate. The crossover dielectric and top electrode were then cofired at 850°–900°C. in a conventional belt furnace using a 45-minute cycle, with about 10 minutes at peak temperature in the middle of the 45-minute cycle. The thickness of the fired crossover dielectric was about two mils.

The dielectric layers were then tested for porosity and found to be dense, as follows. Ink was spread on the fired dielectric area for five minutes and then the dielectric was washed for one minute in running water. The dielectric was observed not to be stained.

Each product was found to be dense; each was free of top electrode sinking.

The dielectric constant was determined for the products of Examples 1–7. Capacitance (C) in picofarads was determined, and dielectric constant (K) was then calculated therefrom, as follows:

$$K = (C \times t)/(0.224 \times A)$$

where $t$ and A are thickness and area of the dielectric in inches. Average values for four duplicate runs (in Example 7 for five duplicate runs) were as set forth in Table III.

TABLE III

| Example | Capacitance (pf) | Dielectric Constant |
|---|---|---|
| 1 | 38.8 | 11.3 |
| 2 | 43.7 | 12.4 |

TABLE II

| Component | Glass Composition (Weight Percent) Example No. | | | | | | | | | |
|---|---|---|---|---|---|---|---|---|---|---|
| | 1 | 2 | 3 | | 5 | 6 | 7 | 8 | 9 | 10 | 11 |
| $SiO_2$ | 30 | 30 | 30 | 30 | 30 | 30 | 30 | 30 | 30 | 30 | 30 |
| $TiO_2$ | 8 | 10 | 8 | 8 | 8 | 8 | 10 | 8 | 8 | 8 | 8 |
| $Al_2O_3$ | 10 | 10 | 10 | 10 | 10 | 12 | 10 | 10 | 10 | 10 | 10 |
| BaO | 12 | 12 | 12 | 12 | 26 | 12 | 26 | 26 | 26 | 26 | 12 |
| ZnO | 26 | 24 | 24 | 22 | 10 | 24 | 12 | 10 | 10 | 12 | 26 |
| CaO | 6 | 6 | 6 | 10 | 6 | 6 | 6 | 10 | 8 | 8 | 8 |
| $B_2O_3$ | 8 | 8 | 8 | 8 | 8 | 8 | 4 | 4 | 4 | 2 | 2 |
| MgO | — | — | 2 | — | 2 | — | 2 | 2 | 2 | — | — |
| $Bi_2O_3$ | — | — | — | — | — | — | — | — | 2 | 4 | 4 |

TABLE III-Continued

| Example | Capacitance (pf) | Dielectric Constant |
|---|---|---|
| 3 | 37.3 | 10.9 |
| 4 | 33.9 | 10.4 |
| 5 | 34.1 | 9.9 |
| 6 | 34.1 | 10.6 |
| 7 *(1) | 35.4 | 12.4 |
| 7 *(2) | 40.5 | 14.0 |

*Two series, (1) fired at 850°C. and (2) at 880°C.

Comparative Showing A

Example 7(2) was repeated (880°C. fire) except that the PbO-containing glass of Example 2 of Hoffman U.S. Pat. No. 3,656,984 was employed to print the crossover dielectric. The glass contained 27% $SiO_2$, 11% $Al_2O_3$, 32% PbO, 8% BaO, 10% ZnO, and 12% $TiO_2$. The resultant properties were significantly inferior to those reported above for the present invention. Specifically, the average dielectric constant based upon five runs was 20.4 (average capacitance 68.2).

Comparative Showing B

The procedure of Examples 1–11 was repeated using a glass composition not of the present invention. The glass contained no PbO, and hence was likewise outside that of U.S. Pat. no. 3,656,984. The fired structure was useless since the dielectric was too soft (it had less than 20 percent crystals) and the top electrode sank into the dielectric during cofiring of the top electrode and the dielectric (electrode sinking destroyed the solderability of top electrode). The glass composition was 33% $SiO_2$, 10% $TiO_2$, 10% $Al_2O_3$, 12% BaO, 5% ZnO, 9% CaO, 10% $B_2O_3$, 1% MgO, and 10% $Bi_2O_3$.

In the claims and elsewhere in the specification, when it is said that the glass compositions of this invention consist essentially of certain proportions of glass constituents, it is meant that up to about 5 percent of other normal glass constituents which do not affect the basic novel properties of the crossovers produced therewith may be present.

I claim:

1. A finely divided glass composition which forms a dense body containing a crystalline phase dispersed in a glassy matrix when fired; the crystalline phase comprising 20–48 percent by weight of said dense body and consisting essentially of celsian as its major component in addition to lesser amounts of sphene and zinc orthosilicate; the glass composition being useful for producing printed dielectric layers between conductor patterns on a dielectric substrate, said glass composition consisting essentially of, by weight, approximately 25–40% $SiO_2$
5–15% $TiO_2$
7–12% $Al_2O_3$
10–30% BaO
10–26% ZnO
2–10% CaO
2– 8% $B_2O_3$
0– 2% MgO
0– 4% $Bi_2O_3$ the total of BaO and ZnO being 30–40 percent of the glass composition.

2. A glass composition according to claim 1 dispersed in an inert liquid vehicle, there being 0.4–9 parts of glass per part of vehicle, by weight.

3. A glass composition according to claim 1 consisting essentially of, by weight, approximately, 30–33% $SiO_2$
8–10% $TiO_2$
10–12% $Al_2O_3$
12–26% BaO
10–26% ZnO
6–10% CaO
2– 8% $B_2O_3$
0– 2% MgO
0– 4% $Bi_2O_3$

4. A glass composition according to claim 3 dispersed in an inert liquid vehicle, there being 0.4–9 parts of glass per part of vehicle, by weight.

5. A glass composition according to claim 3, consisting essentially of, by weight, approximately 30% $SiO_2$
8–10% $TiO_2$
10% $Al_2O_3$
26% BaO
10–12% ZnO
6–10% CaO
4% $B_2O_3$
2% MgO the total weight of BaO and ZnO being 36–38 percent of the glass composition.

6. A glass composition according to claim 5 dispersed in an inert liquid vehicle, there being 0.4–9 parts of glass per part of vehicle, by weight.

* * * * *